(12) United States Patent
Shepphard et al.

(10) Patent No.: US 12,015,380 B2
(45) Date of Patent: Jun. 18, 2024

(54) RADIO FREQUENCY POWER AMPLIFIER

(71) Applicant: Leonardo UK Ltd, London (GB)

(72) Inventors: Daniel Shepphard, Basildon (GB);
Stephen Cripps, Basildon (GB);
Jeffrey Powell, Basildon (GB);
Roberto Quaglia, Basildon (GB)

(73) Assignee: LEONARDO UK LTD, London (GB)

( * ) Notice: Subject to any disclaimer, the term of this patent is extended or adjusted under 35 U.S.C. 154(b) by 449 days.

(21) Appl. No.: 17/289,897

(22) PCT Filed: Oct. 31, 2019

(86) PCT No.: PCT/EP2019/079858
§ 371 (c)(1),
(2) Date: Apr. 29, 2021

(87) PCT Pub. No.: WO2020/089405
PCT Pub. Date: May 7, 2020

(65) Prior Publication Data
US 2022/0006428 A1     Jan. 6, 2022

(30) Foreign Application Priority Data
Oct. 31, 2018   (GB) ..................... 1817747

(51) Int. Cl.
*H03F 3/68*   (2006.01)
*H03F 1/02*   (2006.01)
(Continued)

(52) U.S. Cl.
CPC ......... *H03F 1/0288* (2013.01); *H03F 1/0266* (2013.01); *H03F 1/56* (2013.01);
(Continued)

(58) Field of Classification Search
CPC ........ H03F 1/0288; H03F 1/0266; H03F 1/56; H03F 3/193; H03F 3/604;
(Continued)

(56) References Cited

U.S. PATENT DOCUMENTS 6,297,696 B1 * 10/2001 Abdollahian ........... H03F 3/602
375/238
6,437,718 B1   8/2002 Oyama et al.
(Continued)

FOREIGN PATENT DOCUMENTS

| GB | 2533824 A | 7/2016 |
|---|---|---|
| JP | H02-051287 B2 | 11/1990 |

(Continued)

OTHER PUBLICATIONS

International Search Report (PCT/ISA/210) and Written Opinion (PCT/ISA/237) dated Dec. 17, 2019, by the Japan Patent Office as the International Searching Authority for International Application No. PCT/JP2019/037497.
(Continued)

*Primary Examiner* — Khanh V Nguyen
(74) *Attorney, Agent, or Firm* — BUCHANAN INGERSOLL & ROONEY PC

(57) ABSTRACT

A balanced amplifier system having input and output quadrature couplers or equivalents thereof and two amplifiers there between. An RF signal is presented to a first input of an input quadrature coupler such that an amplified RF signal is output at a first output of the output quadrature coupler. A RF control signal is presented to a second input of the quadrature coupler such that an amplified control signal is outputted at the other output of the output quadrature coupler. The system is configured to reflect the ampli- (Continued)

fied signal back into the second port of the output quadrature coupler in order to vary an impedance seen by the amplifiers of the balanced amplifier.

18 Claims, 2 Drawing Sheets

(51) Int. Cl.
*H03F 1/56* (2006.01)
*H03F 3/193* (2006.01)
*H03F 3/60* (2006.01)

(52) U.S. Cl.
CPC ............ *H03F 3/193* (2013.01); *H03F 3/604* (2013.01); *H03F 2200/192* (2013.01); *H03F 2200/198* (2013.01); *H03F 2200/204* (2013.01); *H03F 2200/321* (2013.01); *H03F 2200/336* (2013.01); *H03F 2200/387* (2013.01); *H03F 2200/451* (2013.01)

(58) Field of Classification Search
CPC ......... H03F 2200/192; H03F 2200/198; H03F 2200/204; H03F 2200/321; H03F 2200/336; H03F 2200/387; H03F 2200/451; H03F 3/602; H03F 3/189; H03F 3/68; H03F 3/211; H03F 3/195; H03F 3/607; H03F 3/60
USPC ...................................... 330/124 R, 286, 295
See application file for complete search history.

(56) References Cited

U.S. PATENT DOCUMENTS

| 7,064,606 | B2 | 6/2006 | Louis | |
| 7,183,843 | B1* | 2/2007 | Jones | H03F 3/602 |
| | | | | 330/53 |
| 7,795,966 | B2* | 9/2010 | Wyse | H03F 3/24 |
| | | | | 330/207 P |
| 8,737,944 | B2 | 5/2014 | Kenington | |
| 8,970,297 | B2* | 3/2015 | Lin | H03F 1/0288 |
| | | | | 330/124 R |
| 9,431,969 | B2* | 8/2016 | Jeon | H03F 3/195 |
| 9,948,243 | B2* | 4/2018 | Kobayashi | H03F 3/193 |
| 2015/0091653 | A1 | 4/2015 | Kobayashi et al. | |
| 2017/0019071 | A1 | 1/2017 | Kobayashi et al. | |
| 2017/0077613 | A1 | 3/2017 | Banu et al. | |
| 2022/0071406 | A1 | 3/2022 | Dorshorst | |

FOREIGN PATENT DOCUMENTS

| JP | 2002043946 A | 2/2002 |
| JP | 2007535828 A | 12/2007 |
| JP | 2018501726 A | 1/2018 |
| WO | 2020035140 A1 | 2/2020 |

OTHER PUBLICATIONS

Lim, J. et al., "A Balanced Power Amplifier Utilizing the Reflected Input Power", IEEE International Symposium on Radio-Frequency Integration Technology, IEEE, pp. 88-91, Jan. 2009.

Quaglia, R. et al., "Analysis and characterization of a load modulated balanced amplifier for base-station applications", 2018 11th German Microwave Conference (GEMIC), pp. 1-4, Mar. 12, 2018, XP033345203.

Regev, D. et al., "Modified re-configurable quadrature balanced power amplifiers for half and full duplex RF front ends", 2018 Texas Symposium on Wireless and Microwave Circuits and Systems (WMCS), IEEE, pp. 1-4, Apr. 5, 2018, XP033368672.

Search Report dated Apr. 17, 2019, issued in corresponding United Kingdom Application No. GB1817747.7. (6 pages).

Office Action (Communication) dated Apr. 24, 2023, by the European Patent Office in corresponding European Patent Application No. 19 798 234.1. (9 pages).

First Office Action dated Mar. 28, 2023, by the Japanese Patent Office in corresponding Japanese Patent Application No. 2021-523695, and an English Translation of the Office Action. (4 pages).

Office Action dated May 20, 2022, by the Canadian Patent Office in corresponding Canadian Patent Application No. 3,117,456. (8 pages).

First Office Action dated May 31, 2022, by the Japanese Patent Office in corresponding Japanese Patent Application No. 2021-523695, and an English Translation of the Office Action. (9 pages).

Office Action issued on Mar. 31, 2024, by the Saudi Arabian Patent Office in corresponding Saudi Arabian Patent Application No. 521421918. (10 pages).

* cited by examiner

RADIO FREQUENCY POWER AMPLIFIER

The present invention relates to an improved balanced radio frequency power amplifier.

There is a desire for power amplifiers to be highly efficient to reduce the power they consume. This reduces the need for cooling and thus the power consumption of the overall system that it forms part. This is particularly important in applications with a limited power supply.

The efficiency of a conventional radio frequency power amplifier (RFPA) degrades very quickly as the output power is reduced (commonly termed 'power back-off' or PBO). As such, amplitude modulated radio systems, where the output power is highly variable during transmission, operate at a much lower efficiency than the peak potential efficiency of the RFPA.

The "Doherty" power amplifier (PA), which is in widespread use in modern mobile communications systems, provides improved efficiently over conventional balanced power amplifiers. A Doherty power amplifier comprises a main amplifier and a peaking amplifier, typically being of different operating classes, arranged such that the peaking amplifier operates together with the main amplifier over a defined input power range.

The Doherty PA, however, generally has limited operational bandwidth and as such is little used in electronic warfare (EW) systems where high efficiency over a wide bandwidth is desired. This limitation also poses a problem in the development of new mobile communication systems that require greater bandwidths.

U.S. Pat. No. 7,064,606B2 describes a Doherty PA that uses multiple auxiliary stages, which results in a flatter efficiency characteristic with power back-off. It comprises a quadrature output combiner which has an reactive loaded isolated port. A quadrature coupler is also used to split the single input signal into two equal quadrature components.

Alternative load modulation techniques such as the Chireix outphasing architecture use two amplifiers driven independently from phase offset signals. The two amplifiers are then connected to a common load whereby the current flowing through that load is a superposition of the phase and magnitude of the output signals of the two amplifiers. Load modulation is achieved through varying the phase of one of the input signals whereby the phase offset in the output signal causes either constructive or destructive modulation of the waveform across the load thereby increasing or decreasing the magnitude of the load current which translates to an increase or decrease in output power. Since the two amplifiers are connected across the common load, the apparent load seen by the two amplifiers is also modulated. A difficulty with Chireix amplifiers is that they require a differential load which makes realising usable amplifiers difficult, as typically the load is external and referenced to ground. The second problem is that the load modulation effect with phase offset creates highly reactive apparent loads to be presented to each amplifier but with a differing reactive sign, i.e. one amplifier experiences a positive reactance and the other a negative reactance. To extend the useful 'power back-off' range of the amplifier through phase offset control, it is necessary to add phase compensation networks to each of the amplifier output networks which limit their operational bandwidth.

GB2533824 describes a balanced amplifier in which the input signal is presented to an isolated port of the output coupler in order to vary the impedance seen by the amplifiers of the balanced amplifier. This arrangement extends the efficiency of the balanced amplifier over a wider input power range compared with a traditional balanced amplifier, and can operate over a wider bandwidth compared with a traditional Doherty PA.

In order for the amplifier to work effectively the input signal presented to the isolated port is first amplified by an auxiliary amplifier. The auxiliary amplifier requires continual careful adjustment to accurately control the amplitude of the signal injected into the isolated port of the output coupler to ensure the signal has a positive rather than detrimental effect on efficiency. Control of amplitude of the signal can in practice be difficult. Additionally, the efficiency of the auxiliary amplifier can have a detrimental effect on the overall amplifier efficiency. The following invention was conceived to improve on the amplifier of GB2533824A.

According to a first aspect of the invention there is provided a radio frequency power amplifier system for amplifying an RF signal, comprising:

a balanced amplifier having an input quadrature coupler means, an output quadrature coupler means, and two amplifiers there-between; the output quadrature coupler means having a first output at which the amplified RF signal is outputted;

the radio frequency power amplifier system further comprising means to modify and/or modulate the impedance at outputs of the two amplifiers; characterised in said means comprising:

a radio frequency control signal source arranged to provide a RF control signal that is amplified by the two amplifiers such that an amplified RF control signal is outputted at a second output of the output quadrature coupler; and a signal reflector connected to the second output of the output quadrature coupler arranged to reflect the amplified control signal back to the second output of the output quadrature coupler.

The invention provides an alternative way of providing a signal to the 'isolated port' of the output coupler in order to vary the impedance at the output of the amplifiers to improve the efficiency of the amplifier when operating at or below peak power transmission.

As the control signal reflected back into the second port has already been amplified by the two amplifiers, the balanced amplifier design of the invention obviates the need and thus problems associated with providing an auxiliary amplifier.

To strongly reflect the amplified signal (as opposed to dissipating it) back into the second output of the output coupler quadrature, the signal reflector may comprise a reactive load. The reactive load may be substantially purely reactive (i.e. having a reflection coefficient that is substantially unity) or may be a mixed resistive reactive load. The reactive load may comprise a capacitive and/or inductive electrical component.

Alternatively the signal reflector could be implemented by connecting the second output of the output coupler means to a load having near zero electrical impedance (i.e. the second output is short circuited) or by not connecting a load to the second output of the output coupler means (terminated in an open circuit), implemented, for example, by fixed capacitors or inductor components or alternatively by sections of transmission line terminated in an "open circuit" or "short circuit"

The input quadrature coupler means may have a first input for receive a RF input signal to be amplified.

The radio frequency control signal source may be connected to a second input of the input quadrature coupler means to provide the RF control signal to the second input of the input quadrature coupler means such that an amplified RF control signal is outputted at a second output of the output quadrature coupler means.

The RF control signal source is favourably arranged to provide an RF control signal having a frequency that substantially matches the RF input signal, and further adapted to vary the RF control signal to match any changes in the frequency of the input signal.

The amplifier system is favourably arranged such that the phase of the control signal entering the input coupler is offset to the input signal, and that the offset favourably remains fixed.

The RF control signal may be derived from the RF input signal, e.g. by way of the control signal source comprising a splitter arranged to split the RF input signal. Alternatively the control signal source may comprise a control signal generator separate from the input signal source.

In one arrangement the radio frequency power amplifier system comprises a signal generator having a first generator output and a second generator output, the signal generator comprising one or more processors adapted to execute at least one computer program to: digitally generate the RF input signal for output at the first generator output; and digitally generate the RF control signal for output at the second generator output.

The output quadrature coupler means may be implemented by and output quadrature coupler having two inputs and two outputs. Alternatively it could be provided by delay lines, through this is usually less preferred as it provides narrow bandwidth.

Similarly the input quadrature coupler means may comprise an input quadrature coupler having two inputs and two outputs or by delay lines, the former being preferred for the same reason as described for the output quadrature coupler.

Alternatively the function of the input quadrature coupler means may be implemented by the signal generator, the signal generator arranged to digitally generate a first RF signal for output at the first output of the signal generator that corresponds to the desired signal at a first output of the input quadrature coupler means for input to a first amplifier of the two amplifiers, and to digitally generate a second RF signal for output at the second output of the signal generator that corresponds to the desired signal at a second output of the input quadrature coupler means for input to a second amplifier of the two amplifiers.

Favourably the power amplifier comprises means to modify the phase and/or amplitude of the RF control signal (before and/or after reflection) to match and/or modulate the impedance at the outputs of the two amplifiers. This may be achieved in a number of ways that can be used together or in combination.

For example, in one arrangement the amplifier may comprise a phase shifter (which may be a variable or fixed phase shifter (or a fixed or variable delay line) to phase shift the RF control signal before it enters the input coupler; the control signal source may be arranged to modify the phase of the outputted control signal. A variable phase shifter may be connected to a controller, the controller arranged to control the variable phase shifter to tune the phase of the control signal.

Where the amplifier comprises a reactive load, the reactive load may be tuneable, e.g. under control of a controller, in order to allow for adjustment the phase of the reflected amplified signal. The tuneable reactive load may comprise a switched capacitive network and/or switched inductive network.

The amplitude of the control signal may (as per the phase shift) be varied by the control signal generator. In arrangements where the system comprises a single signal source which is split to provide both the control signal and input signal, the system may comprise a fixed or variable attenuator (with digital or analogue control) from controller. The amplitude of the control signal may typically be between 0.1 to 0.25 times the level of maximum RF input signal.

By being able to vary the phase and amplitude of the control signal relative to the input signal reflected back into the balanced amplifier provides greater flexibility and efficiency over a wide frequency band compared with the amplifier of U.S. Pat. No. 7,064,606B2 where through having only a single input signal the load impedance presented to the amplifiers is only modified by the load connected to the output coupler.

The term radio frequency in this specification should be taken to at least include frequencies between 20 KHz to 300 GHz. In the applicant's expected primary application of the invention of an electronic warfare system, the input signal may be between 20 MHz-40 GHz.

The invention may also be expressed in the form of a method and therefore according to a second aspect of the invention there is provided a method to modify and/or modulate the impedance at outputs of the two amplifiers of a balanced amplifier within a radio frequency power amplifier system the method comprising:

inputting a radio frequency input signal to be amplified into a first input of an input quadrature coupler of the balance amplifier;

inputting a radio frequency control signal into a second input of the input quadrature coupler to provide a RF control signal to the second input of the input quadrature coupler such that an amplified RF control signal is outputted at a second output of the output quadrature coupler; and reflecting the amplified control signal outputted from an output of an output quadrature coupler of the balance amplifier back to the second output of the output quadrature coupler.

According to a third aspect of the invention there is provided a method to modify and/or modulate the impedance at outputs of two amplifiers of a balanced amplifier arranged to amplify a radio frequency (RF) signal, the balanced amplifier comprising an output quadrature coupler means, the amplified RF signal being outputted at a first output of the output quadrature means, the method comprising:

providing a radio frequency (RF) control signal and arranging the RF control signal to be amplified by the balanced amplifier, such that an amplified RF control signal is outputted at a second output of the output quadrature coupler; and reflecting the amplified RF control signal outputted from the second output of the output quadrature coupler back to the second output of the output quadrature coupler.

The method variously described above may comprise modifying the phase and/or amplitude of the RF control signal and/or of the amplified RF control signal relative to the input signal.

The invention will now be described by way of example with reference to the following figures.

Figure 1:
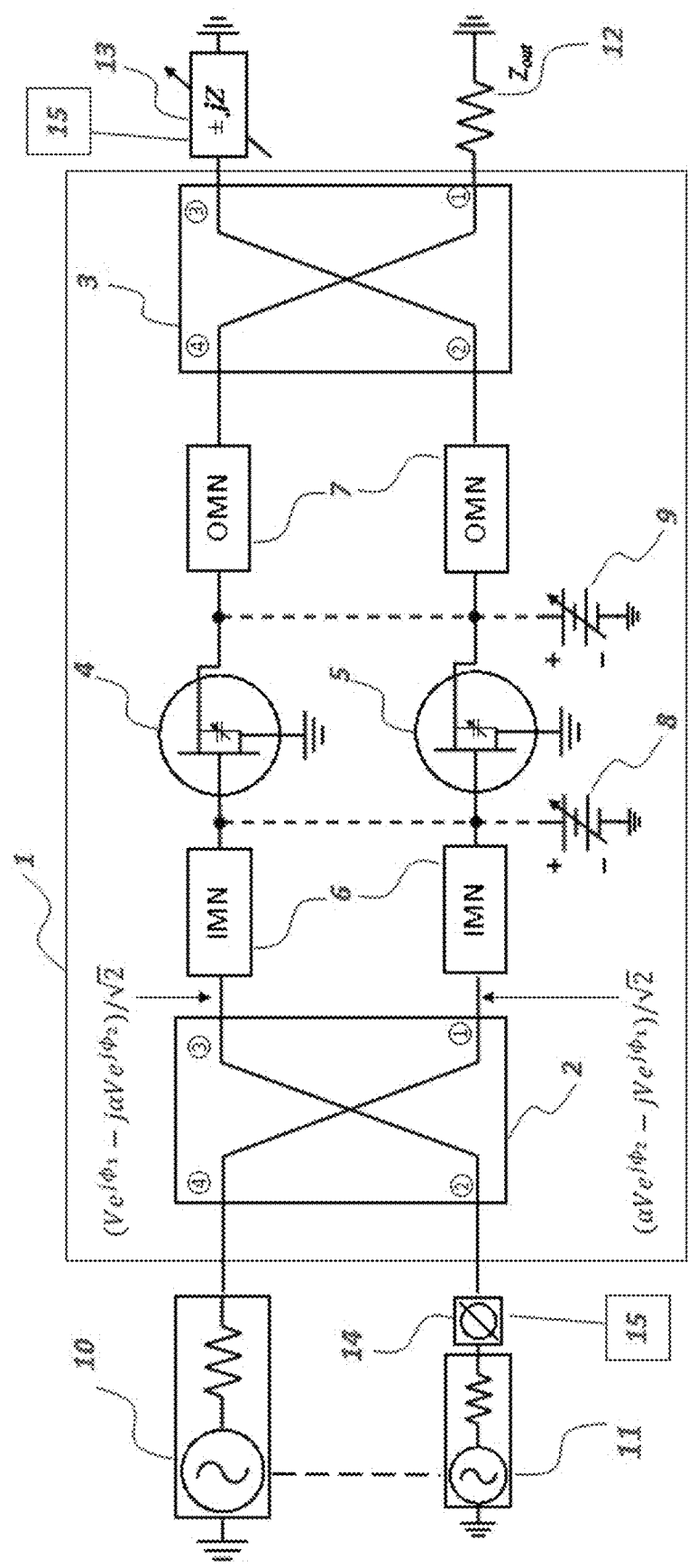
FIG. 1 is a schematic of a radio frequency power amplifier system.

Referring to the FIG. 1 the radio frequency power amplifier system comprises a balanced amplifier 1 having an input quadrature coupler 2, an output quadrature coupler 3, and amplifying circuit there between comprising two amplifiers 4, 5. In this embodiment the two amplifiers 4, 5 are 3W single transistors though more complex arrangements and/or different power levels may be used.

The amplifying circuit also includes an input matching network 6 and an output matching network 7 associated with each amplifier, together with independent DC voltage sources 8,9 for biasing the transistor amplifiers. The amplifying circuit is in itself of conventional design and so will not be described in further detail.

The input quadrature coupler 1 has a first input port 2④ for receiving an RF input signal to be amplified from an input signal source 10, a second input port 2② (which in a conventional balanced amplifier would be terminated in a matched load) for receiving a RF control signal from a control signal source 11, and first and second outputs 2③, 2①.

In the example of FIG. 1, the input signal source 10 and the control signal source 11 comprise separate second signal generators, the signal generators being phase locked. This is typically preferred as it provides independent amplitude and phase control. Alternatively, however, the input and control signal sources 10, 11 may be provided by a single signal generator and a splitter that splits the signal outputted from the single signal generator to provide the input signal and control signal. In the latter system there may be provided additional amplifier circuits and/or attenuator circuits and/or phase control circuits to provide independent control of the amplitude and/or phase of the input and control signals. Irrespective of the mode of generating the input signal and control signal, it is preferred that they have the same frequency.

The input quadrature coupler 2 splits the input signal received at the first input 2④ to both outputs 2③, 2①; the input signal at 2① having undergone a ninety degree phase shift. Similarly, the input quadrature coupler 2 splits the received control signal at the second input 2② to both outputs 2③, 2①, the control signal at the first output 2③ undergoing a ninety degree phase shift. As such, the signal at the first output 2③ is a superposition of the input signal at phase angle 0 and the control signal shifted by a phase angle of −90 degrees. The signal leaving the second output 2① is a superposition of the control signal at phase angle 0 and the input signal shifted by a phase angle of −90 degrees.

The signals at the outputs 2③, 2① are fed to the respective amplifiers 4, 5 of the amplifying circuit. The outputs of the amplifiers 4,5 are in turn fed to respective first input port 3④ and second input port 3② of the output quadrature coupler 3.

The output coupler 3 applies the same function to the signals received at its inputs 3④,3② as the input coupler (as is conventional in a balanced amplifier). As such, the input signal, now amplified, is outputted at a second output 3① for input to a load 12, e.g. an antenna or other circuit fragment, connected to the second output 3① to receive the output of the power amplifier.

The output coupler 3 provides at its first output 3③ the control signal, amplified. The first output 3③ of the output coupler 3 is connected to a tuneable reactive load 13 adapted to preferentially reflect the amplified control signal back into the first output 3③ of the output coupler 3. This is in contrast with a conventional design of balanced amplifier in which the first output is terminated with a matched load.

For the reasons expounded in GB2533824A, presenting a signal to the first output 3③ of the output coupler acts to modulate the impedance at the outputs of the two amplifiers 4,5. Through control of amplitude and phase of the reflected amplified control signal it is possible to vary the impedance at the amplifier outputs 4,5 so that optimum efficiency is maintained as the power and frequency of the input signal from signal source 10 varies.

Modification of the amplitude and/or phase of the control signal reflected back into the second output port 3③ can be performed in two ways which may be used together or separately.

The phase of the control signal outputted from the control signal source 11 is modifiable using a phase shifter 14 (under control of controller 15) arranged between the control signal source 11 and input coupler 2 and which outputs a phase shifted control signal to the second input 2② of the input coupler 2. The phase shifter 14 may be a variable or fixed phase shifter (or a variable or fixed delay line).

The phase of the control signal reflected back towards the first output 3③ of the output coupler 3 is also adjustable by varying the reactance of the reactive load 13. The reactive load 13 comprises a switched capacitive network and/or a switched inductive network connected to the controller 15 (illustrated twice in FIG. 1 to simplify the drawing layout). The controller 15 switches the various capacitors and/or inductors within the respective networks in order to vary the reactive load's effective reactance.

The controller 15 used to control the reactive load 11 and phase shifter 14 is implemented using as one or more suitably programmed processors using techniques familiar to those skilled in the art.

In order to terminate any reflected power from the input coupler 2, both the control signal source 11 and input signal source 10 comprise a load that is impedance matched to the input coupler 2.

Figure 2:
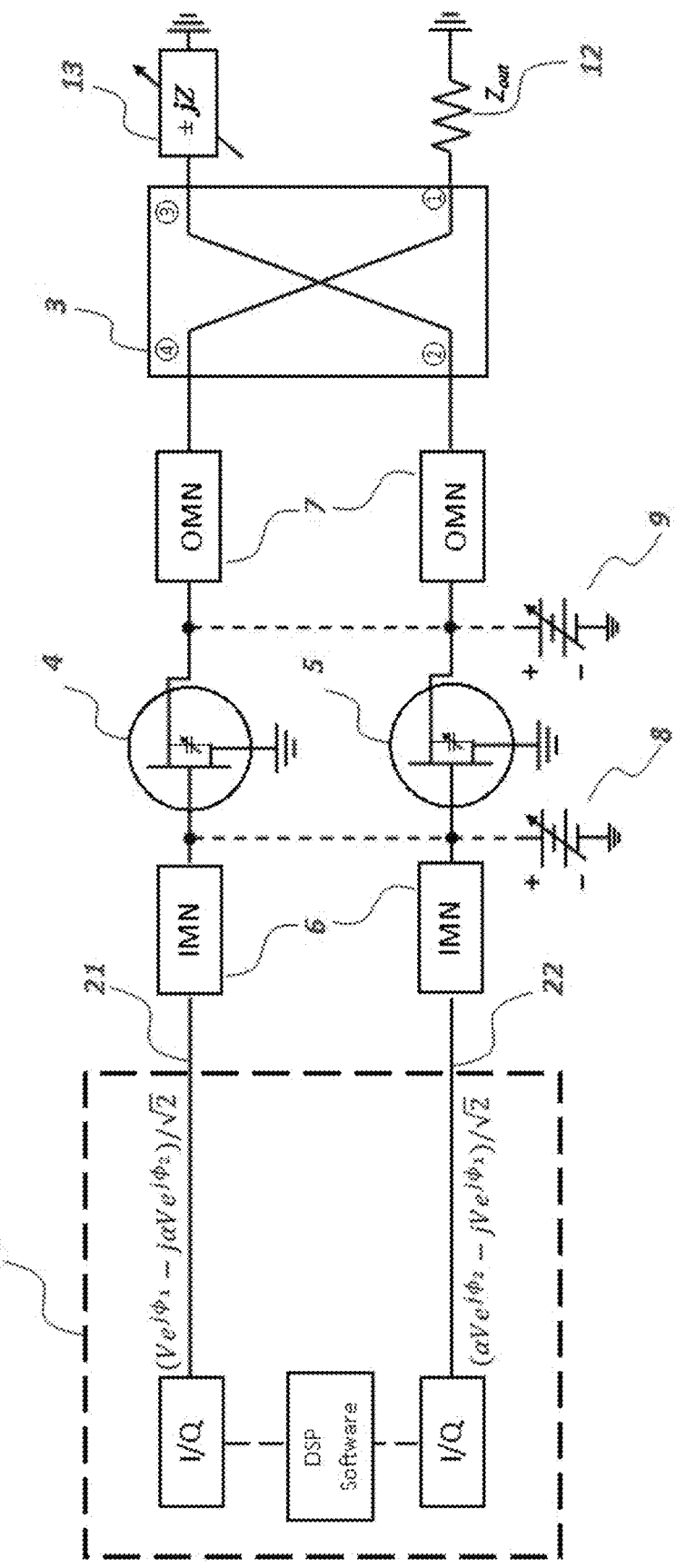
FIG. 2 is a variant of the power amplifier system of FIG. 1 in which the function of the input quadrature coupler and phase shifter is carried out by a digital signal generator.

FIG. 2 illustrates a variant design of power adaptor comprising a digital signal generator 20 that calculates and generates both the input signal and control signal and additionally implements the functions of the input quadrature coupler 2 and phase shifter 14.

The digital signal generator 20 is implemented at least in part using digital signal processing system by one or more suitably programmed processors running one or more computer programs.

The digital signal generator 20 is arranged to calculate and output at a first output 21 for receipt by the first amplifier 4, a first signal that corresponds the desired output signal at first output 2③ of the input coupler of FIG. 1. The digital signal generator 20 is also arranged to calculate and output at a second output 22 for receipt by the second amplifier 5 a second signal corresponding to the desired output signal at second output 2① of the input coupler of FIG. 1.

Although the preceding explanation is based around a conventional balanced amplifier the inclusion of a second, phase variable, input source enables the system to achieve a degree of outphasing much like that of a system using a Chireix outphasing amplifier. With the presented architecture, outphasing is achieved through the reflection of power from the reflected load where the amplitude and phase of the reflected signal is set by the phases of the main input signal and second signal source presented at the input of the amplifier.

It is also possible that the output matching networks 7 may not be identical so as to provide complementary loading to the two amplifiers 4,5 (for instance one output matching network presenting a positively reactive load to one amplifier whilst the other output matching network presents a negatively reactive load to the other amplifer). This, in combination with tuning of the control signal modify the impedance presented to the amplifiers 4,5 allows for a high efficiency outphasing amplifier that will maintain high efficiency whilst operating at sub maximum amplification but with significant improvements to the impedance modulation capability as compared to existing implementation of Chirex amplifiers, due to the fixed or tuneable reactive load 13 presented at the output coupler 3. Since the amplifier is still in a balanced configuration, power extraction requires a conventional and more practical output load referenced to ground.

In the aforementioned embodiments the amplifiers 4, 5 have the same DC voltage at their input and output as provide by DC sources 8,9, In a variation each amplifier 4, 5 can be independently controlled by different voltages at their respective inputs and outputs to allow a different mode of operation; such an arrangement would require separate DC voltage sources for each amplifier 4,5.

In an further alternative embodiment, the system may omit one or both impedance matching networks 6,7 and use the means described above to control amplitude and phase of the reflected amplified signal to tune for transistor parasitic effects such as output capacitance.

The amplifier described variously above may be implemented as an integrated circuit e.g. RFIC or MIMIC manufactured from, for example GaAs or GaN semiconductor, though it could be implemented partly or exclusively of discrete components.

The phase offset setting and amplitude of the control signal required to provide the desired output at the second output of the output coupler for any given frequency of operation can be determined through calibration of the design (or each unit) before operation. The controller 15 can then be pre-programmed with the determined control signal gain/phase settings. The system may alternatively include a power and frequency monitor (not shown) at the amplifier system input and/or output port and dynamically control the control signal gain/phase settings through feedback software routines to dynamically optimise the transistor(s) drain impedance so as to improve power and/or efficiency.

The invention claimed is:

1. A radio frequency power amplifier system for amplifying an RF signal, the system comprising:
    a balanced amplifier having an input quadrature coupler, an output quadrature coupler, and two amplifiers therebetween; the output quadrature coupler having a first output at which the amplified RF signal will be output;
    means to modify and/or modulate an impedance at outputs of the two amplifiers, said means including:
    a radio frequency control signal source connected to the two amplifiers and configured to provide an RF control signal that will be amplified by the two amplifiers such that an amplified RF control signal will be output at a second output of the output quadrature coupler; and
    a signal reflector connected to the second output of the output quadrature coupler and arranged to reflect the amplified RF control signal back to the second output of the output quadrature coupler.

2. The radio frequency power amplifier system according to claim 1, wherein the input quadrature coupler has a first input for receiving a RF input signal to be amplified;
    wherein the radio frequency control signal source is connected to a second input of the input quadrature coupler to provide the RF control signal to the second input of the input quadrature coupler such that the amplified RF control signal will be output at the second output of the output quadrature coupler.

3. The radio frequency power amplifier system according to claim 2, wherein the radio frequency control signal source is configured to provide the RF control signal with a frequency that is substantially the same as the RF input signal.

4. The radio frequency power amplifier system according to any claim 3, comprising:
    means to modify a phase and/or amplitude of the RF control signal and/or the amplified RF control signal.

5. The radio frequency power amplifier system according to claim 4, wherein the means to modify the phase and/or amplitude of the RF control signal and/or the amplified RF control signal comprises:
    a phase shifter to shift a phase of the RF control signal entering the second input of the input quadrature coupler.

6. The radio frequency power amplifier system according to claim 5, wherein the signal reflector comprises:
    a reactive load.

7. The radio frequency power amplifier system according to claim 6, wherein the reactive load is a tunable reactive load; and
    the radio frequency power amplifier system comprises:
    a controller connected to the tunable reactive load and configured to tune the reactive load to vary a phase of the reflected amplified RF control signal.

8. The radio frequency power amplifier system according to claim 7, wherein the tunable reactive load comprises:
    a switched capacitor network and/or switched inductor network.

9. The radio frequency power amplifier system according to claim 8, comprising:
    a signal generator having a first generator output and a second generator output, the signal generator including one or more processors configured to run a computer program that will cause the signal generator to:
    digitally generate an RF signal for output at the first generator output; and
    digitally generate the RF control signal for output at the second generator output.

10. The radio frequency power amplifier system according to claim 9, wherein the input quadrature coupler is implemented by the signal generator, the signal generator being configured to:
    digitally generate a first RF signal for output at the first generator output of the signal generator that corresponds to a desired signal at a first output of the input quadrature coupler for receipt by a first amplifier of the two amplifiers; and
    digitally generate a second RF signal for output at the second generator output of the signal generator that corresponds to a desired signal at a second output of the input quadrature coupler for receipt by a second amplifier of the two amplifiers.

11. The radio frequency power amplifier system according to claim 1, wherein the signal reflector comprises:
    a reactive load.

12. The radio frequency power amplifier system according to claim 11, wherein the reactive load is a tunable reactive load; and
    the radio frequency power amplifier system comprises:
    a controller connected to the tunable reactive load and configured to tune the reactive load to vary a phase of the reflected amplified RF control signal.

13. The radio frequency power amplifier system according to claim 12, wherein the tunable reactive load comprises:
    a switched capacitor network and/or switched inductor network.

14. The radio frequency power amplifier system according to claim 13, comprising:
- a signal generator having a first generator output and a second generator output, the signal generator including one or more processors configured to run a computer program that will cause the signal generator to:
- digitally generate an RF signal for output at the first generator output; and
- digitally generate the RF control signal for output at the second generator output.

15. The radio frequency power amplifier system according to claim 14, wherein the input quadrature coupler is implemented by the signal generator, the signal generator being configured to:
- digitally generate a first RF signal for output at the first generator output of the signal generator that corresponds to a desired signal at a first generator output of the input quadrature coupler for receipt by a first amplifier of the two amplifiers; and
- digitally generate a second RF signal for output at the second generator output of the signal generator that corresponds to a desired signal at a second generator output of the input quadrature coupler for receipt by a second amplifier of the two amplifiers.

16. A method to modify and/or modulate an impedance at outputs of two amplifiers of a balanced amplifier arranged to amplify a radio frequency (RF) signal, the balanced amplifier having an output quadrature coupler, an amplified RF signal being outputted at a first output of the output quadrature coupler, the method comprising:
- using a radio frequency control signal source connected to the two amplifiers to provide a radio frequency (RF) control signal that is amplified by the two amplifiers of the balanced amplifier, such that an amplified RF control signal is outputted at a second output of the output quadrature coupler; and
- reflecting the amplified RF control signal outputted from the second output of the output quadrature coupler back to the second output of the output quadrature coupler.

17. The method of claim 16, comprising:
- inputting an RF input signal to be amplified into a first input of an input quadrature coupler of the balanced amplifier; and
- inputting an RF control signal into a second input of the input quadrature coupler to provide a RF control signal to the second input of the input quadrature coupler such that the amplified RF control signal is outputted at a second output of the output quadrature coupler.

18. The method according to claim 17, comprising:
- modifying a phase and/or amplitude of the RF control signal and/or the amplified RF control signal relative to the RF input signal.

* * * * *